United States Patent [19]

Bovenkerk et al.

[11] Patent Number: 5,302,231
[45] Date of Patent: Apr. 12, 1994

[54] CVD DIAMOND BY ALTERNATING CHEMICAL REACTIONS

[75] Inventors: Harold P. Bovenkerk, Worthington, Ohio; Thomas R. Anthony, Schenectady, N.Y.; James F. Fleischer, Scotia, N.Y.; William F. Banholzer, Columbus, Ohio

[73] Assignee: General Electric Company, Worthington, Ohio

[21] Appl. No.: 956,817

[22] Filed: Oct. 5, 1992

Related U.S. Application Data

[63] Continuation of Ser. No. 618,149, Nov. 26, 1990, abandoned.

[51] Int. Cl.$^5$ ............................................. C30B 25/00
[52] U.S. Cl. ........................ 156/614; 156/DIG. 68; 423/446; 427/249; 427/255.1; 437/100
[58] Field of Search .................... 156/DIG. 68, 614; 423/446; 427/248, 249, 38, 39; 437/100

[56] References Cited

U.S. PATENT DOCUMENTS

| | | | |
|---|---|---|---|
| 3,030,188 | 4/1962 | Eversole | 423/446 |
| 4,882,138 | 11/1989 | Pinneo | 423/446 |
| 4,915,977 | 4/1990 | Okamoto et al. | 423/446 |
| 4,981,818 | 1/1991 | Anthony et al. | 437/100 |
| 5,071,677 | 12/1991 | Patterson et al. | 427/249 |

FOREIGN PATENT DOCUMENTS

| | | | |
|---|---|---|---|
| 0286306 | 10/1988 | European Pat. Off. | |
| 0339992 | 11/1989 | European Pat. Off. | |
| 0180999 | 9/1985 | Japan | 423/446 |
| 2-211195A | 9/1990 | Japan | 156/DIG. 68 |

Primary Examiner—Olik Chaudhuri
Assistant Examiner—Felisa Garrett

[57] ABSTRACT

The present invention relates to a method for growing diamond on a diamond substrate by chemical vapor deposition. The inventive method comprises alternatingly contacting at elevated temperature said diamond substrate with a gas having the formula $C_nX_m$ and then with a gas having the formula $C_lZ_p$. X and Z each form single bonds with carbon. X and Z also are reactable to form ZX or a derivative thereof. The Z—X bond is stronger than the C—X bond and also is stronger than the C—Z bond. In the formulas, n, m, l, and p are integers. If $C_nX_m$ and $C_lZ_p$ do not react in the gas phase, then a gas mixture of them can be used to grow diamond instead of the alternating exposure of one and then the other.

5 Claims, No Drawings

CVD DIAMOND BY ALTERNATING CHEMICAL REACTIONS

This is a continuation of copending application Ser. No. 07/618,149 filed on Nov. 26, 1990, now abandoned.

BACKGROUND OF THE INVENTION

The present invention relates to diamond workpieces and more particularly to their fabrication based on chemical vapor deposition technology.

Its hardness and thermal properties are but two of the characteristics that make diamond useful in a variety of industrial components. Initially, natural diamond was used in a variety of abrasive applications. With the ability to synthesize diamond by high pressure/high temperature (HP/HT) techniques utilizing a catalyst/sintering aid under conditions where diamond is the thermally stable carbon phase, a variety of additional products found favor in the marketplace. Polycrystalline diamond compacts, often supported on a tungsten carbide supports in cylindrical or annular form, extended the product line for diamond additionally. However, the requirement of high pressure and high temperature has been a limitation in product configuration, for example.

Recently, industrial effort directed toward the growth of diamond at low pressures, where it is metastable, has increased dramatically. Although the ability to produce diamond by low-pressure synthesis techniques has been known for decades, drawbacks including extremely low growth rates prevented wide commercial acceptance. Recent developments have led to higher growth rates, thus spurring recent industrial interest in the field. Additionally, the discovery of an entirely new class of solids, known as "diamond like" carbons and hydrocarbons, is an outgrowth of such recent work.

Low pressure growth of diamond has been dubbed "chemical vapor deposition" or "CVD" in the field. Two predominant CVD techniques have found favor in the literature. One of these techniques involves the use of a dilute mixture of hydrocarbon gas (typically methane) and hydrogen wherein the hydrocarbon content usually is varied from about 0.1% to 2.5% of the total volumetric flow. The gas is introduced via a quartz tube located just above a hot tungsten filament which is electrically heated to a temperature ranging from between about 1750° to 2400° C. The gas mixture disassociates at the filament surface and diamonds are condensed onto a heated substrate placed just below the hot tungsten filament. The substrate is held in a resistance heated boat (often molybdenum) and heated to a temperature in the region of about 500° to 1100° C.

The second technique involves the imposition of a plasma discharge to the foregoing filament process. The plasma discharge serves to increase the nucleation density, growth rate, and it is believed to enhance formation of diamond films as opposed to discrete diamond particles. Of the plasma systems that have been utilized in this area, there are three basic systems. One is a microwave plasma system, the second is an RF (inductively or capacitively coupled) plasma system, and the third is a d.c. plasma system. The RF and microwave plasma systems utilize relatively complex and expensive equipment which usually requires complex tuning or matching networks to electrically coupled electrical energy to the generated plasma. Additionally, the diamond growth rate offered by these two systems can be quite modest.

Atomic hydrogen is required, regardless of the particular CVD technique utilized. Atomic hydrogen can be generated in numerous ways. Each way serves as a pathway to develop a new CVD diamond growth process. It has been postulated that atomic hydrogen serves several critical roles in CVD diamond growth, namely: 1) stabilization of the diamond surface; 2) reduction of the size of the critical nucleus; 3) "dissolution" of carbon in the gas; 4) production of carbon solubility minimum; 5) generation of condensible carbon radicals in the gas; 6) abstraction of hydrogen from hydrocarbons attached to the surface; 7) production of vacant surface sites; and 8) etching of graphite. Atomic hydrogen can carry out these functions because of favorable relationships between energies for carbon—carbon, carbon-hydrogen, and hydrogen—hydrogen bonds. A direct substitute for atomic hydrogen has not been proposed in the art.

BROAD STATEMENT OF THE INVENTION

The present invention relates to a method for growing diamond on a diamond substrate by chemical vapor deposition. The inventive method comprises alternatingly contacting at elevated temperatures said diamond substrate with a gas having the formula $C_nX_m$ and then with a gas having the formula $C_lZ_p$. X and Z each form single bonds with carbon. X and Z also are reactable to form ZX or a derivative thereof. The Z—X bond is stronger than the C—X bond and also is stronger than the C—Z bond. In the formulas, n, m, l, and p are integers, wherein l also can be zero. If $C_nX_m$ and $C_lZ_p$ do not react in the gas phase, then a gas mixture of them can be used to grow diamond instead of the alternating exposure of one and then the other. Three or more reactive gases may be used to grow the CVD diamond rather than two gases as described above.

Advantages of the present invention include the ability to convert fine diamond dust of low economic value into diamond particles of higher economic value. Another advantage is the elimination of atomic hydrogen in the CVD process which results in lowering the cost for production of the CVD diamond. Another advantage is a process that is ideally suited to grow single crystal diamond by epitaxy. These and other advantages will be readily apparent to those skilled in the art based on the disclosure contained herein.

DETAILED DESCRIPTION OF THE INVENTION

Potential substitutes for atomic hydrogen must meet a number of conditions in order for them to carry out the various functions that hydrogen carries out during CVD diamond production. Potential substitutes for atomic hydrogen include atoms or molecule groups that form a single bond with carbon. Examples of such substitutes include, for example, F, Cl, Br, I, N, O, S, Si, OH, and $OCH_3$. Because of a lower bond energy in diatomic molecules of these substitutes than the bond energy of molecular hydrogen, these substitute atomic species will have a much higher concentration than atomic hydrogen in otherwise similar conditions.

TABLE 1

Diatomic Binding Energies of Potential Atomic-Hydrogen Substitutes

| Substitute | Diatomic Binding Energy (kcal/mole) |
|---|---|
| Hydrogen-Hydrogen | 104 |
| Sulfur-Sulfur | 60 |
| Chlorine-Chlorine | 58 |
| Silicon-Silicon | 53 |
| Oxygen-Oxygen | 47 |
| Bromine-Bromine | 46 |
| Fluorine-Fluorine | 44 |
| Nitrogen-Nitrogen | 39 |
| Iodine-Iodine | 36 |

In addition to the requirement of forming a single bond with carbon, the product of the reaction between carbon and the substitute must be gaseous. On this basis, Si can be dropped from consideration, for example, since SiC is a solid at CVD diamond growth temperatures. To produce a carbon solubility minimum, there must be exothermic gaseous reaction products at low temperatures and endothermic gaseous reaction products at high temperature between carbon and the substitute.

Most potential atomic hydrogen substitutes etch graphite at much higher rates than atomic hydrogen. If the graphite etching hypothesis is true, then these substitutes would allow higher concentrations of carbon species to be used in the gas, which, in turn, should increase diamond deposition rates.

Once the list of acceptable substitutes has been culled by the above conditions, some quantitative bond energy requirements also must be met. Let X represent the atomic-hydrogen substitute and C represent carbon. Further, let X—X, X—C, and C—C represent, respectively, the X—X, the X—C, and C—C bond energies. If X is to stabilize the diamond surface, then the X—C bond energy must be stronger than the C—C bond energy to prevent the surface reconstruction of diamond. The following table lists the carbon—carbon bond energy and the C—X bond energy for different potential atomic-hydrogen substitutes. Of the list of potential atomic-hydrogen substitutes given above, only F, O, OH, and OCH$_3$ satisfy this condition.

Further, the size of the critical diamond nucleus also is reduced if atomic X reacts with the surface of diamond and lowers its surface energy. Reactivity with the diamond will occur if C—X>C—C. Of the potential atomic-hydrogen substitutes given above, only F, O, OH, and OCH$_3$ satisfy this condition.

TABLE 2

Bond Energies Between Potential Atomic-Hydrogen Substitutes and Carbon

| Substitute-Carbon | Bond Energy (kcal/mole) |
|---|---|
| Fluorine-Carbon | 116 |
| Hydrogen-Carbon | 99 |
| Oxygen-Carbon | 86 |
| Carbon-Carbon | 83 |
| Chlorine-Carbon | 81 |
| Nitrogen-Carbon | 73 |
| Silicon-Carbon | 72 |
| Bromine-Carbon | 68 |
| Sulfur-Carbon | 65 |
| Iodine-Carbon | 52 |

In order for atomic X to generate vacant surface sites and hydrocarbon radicals in the gas or on the diamond surface, the C—X bond must be broken and replaced by an X—X bond. Hence, the X—X bond must be stronger than the C—X bond. Unfortunately, no candidate in the above list of potential atomic-hydrogen substitutes satisfies this latter condition.

Accordingly, instead of a straight substitution for atomic hydrogen, substitutes can be worked into a diamond-growing method by alternative means. The means of the present invention comprises alternatingly contacting at elevated temperature a diamond substrate with a gas having the formula $C_nX_m$ and then with a gas having the formula $C_lZ_p$. This reaction will work because the bond strength of Z—X exceeds the bond strengths of both C—X and C—Z. Both reactions are exothermic. The generalized reaction is set forth below:

$$C_nX_m + \text{diamond-Z} \rightarrow \text{diamond-C—X} + ZX \quad (I)$$

$$C_lZ_p + \text{diamond-X} \rightarrow \text{diamond-C—Z} + ZX, \quad (II)$$

where diamond-Z and diamond-X represent, respectively, diamond covered with a monolayer of Z and X. Since the Z—X bond is stronger than the C—X and C—Z bonds, then alternate exposures of diamond to the respective gases will cause alternate exothermic chemical reactions where carbon is placed down during each exposure.

Moreover, if $C_nX_m$ and $C_lZ_p$ do not react in the gas phase, then a gas mixture of them can be used to grow diamond instead of the alternating exposure of one and then the other depicted in reactions I and II above. In this latter case, the reactions still alternate on a microscale, but not on a macroscopic scale, and can be represented as follows:

$$C_nX_m + C_lZ_p + \text{X-diamond-Z} \rightarrow \text{diamond} + ZX, \quad (III)$$

where X-diamond-Z is diamond covered with a monolayer of a mixture of X and Z.

To illustrate the invention, the following specific proposed pairs of chemical reactions for CVD diamond growth will be given. The bonding energies used in this reaction are as follows:

TABLE 3

| Diamond-H | 91 | kcal/mole |
|---|---|---|
| Diamond-Cl | 78.5 | kcal/mole |
| Diamond-Br | 63 | kcal/mole |
| Diamond-I | 49.5 | kcal/mole |
| Diamond-F | 103 | kcal/mole |
| Diamond-C | 80 | kcal/mole |
| Diamond-OH | 90.5 | kcal/mole |
| Diamond-OCH$_3$ | 78 | kcal/mole |

These values were used rather than the average bonding energies between carbon and the elements given in compilations, as these values are the binding energies of tertiary carbon atoms to these elements, i.e., the bonding energy between an element and a carbon atom which is bound to three other carbon atoms. By using these tertiary bond energies, the exothermic enthalpies of all reactions will be underestimated. Other bond energies are found in the *Handbook of Chemistry and Physics*, The Chemical Rubber Company (Cleveland, Ohio). "Diamond" will be abbreviated by "D" in all of the reactions. Moreover, other reactions use carbon it its fully saturated state so that double or triple bonds of carbon will be difficult to form and the deposit of carbon most likely will form diamond rather than graphite.

EXAMPLE 1

Alternating Exposure to CF$_4$ and CH$_4$

In this example, diamond is exposed in turn to methane and then carbon tetrafluoride over and over again. These reactions always run downhill with respect to energy because the H—F bond is stronger than both the Diamond-C bond and the Diamond-F bond.

| A. Exposure to CH$_4$: | | |
|---|---|---|
| CH$_4 \rightarrow$ CH$_3$ + H | +104 kcal/mole | |
| D – F $\rightarrow$ D + F | +103 | |
| D – CH$_3 \rightarrow$ D – CH$_3$ | –80 | |
| H + F $\rightarrow$ HF | –135 | |
| CH$_4$ + D – F $\rightarrow$ D – CH$_3$ + HF | $\Delta H = -8$ kcal/mole | |
| B. CF$_4 \rightarrow$ CF$_3$ + F | +116 kcal/mole | |
| D – H $\rightarrow$ D + H | +91 | |
| D + CF$_3 \rightarrow$ D – CF$_3$ | –80 | |
| H + F $\rightarrow$ HF | 135 | |
| CF$_4$ + D – H $\rightarrow$ D – CF$_3$ + HF | $\Delta H = -8$ kcal/mole | |

During both reactions, a layer of carbon atoms with saturated sp3 bonds is attached to the diamond lattice. Although both reactions are exothermic, the substrate would have to hold at a temperature high enough to overcome the activation energies of each reaction. The minimum substrate temperature is above 300° C. The actual temperature range probably corresponds closely with the range found with making CVD diamond by the conventional H2—CH4 process.

EXAMPLE 2

Alternating Exposure to CH$_4$ and CCL$_4$

In this example, diamond is exposed to methane and carbon tetrachloride alternatively. Both reactions are exothermic and each exposure results in at least one monolayer of diamond. The reactions are exothermic because the H—Cl bond is stronger than the H—C or the Cl—C bonds.

| A. Exposure to CH$_4$: | |
|---|---|
| CH$_4 \rightarrow$ CH$_3$ + H | +104 kcal/mole |
| D – Cl $\rightarrow$ D + Cl | +78.5 |
| D + CH$_3 \rightarrow$ D – CH$_3$ | –80 |
| H + Cl $\rightarrow$ HCl | =103 |
| CH$_4$ + D – Cl $\rightarrow$ D – CH$_3$ + HCl | $\Delta H = -0.5$ kcal/mole |
| B. Exposure to CCl$_4$: | |
| CCl$_4 \rightarrow$ CCl$_3$ + Cl | +81 kcal/mole |
| D – H $\rightarrow$ D + H | +91 |
| D + CCl$_3 \rightarrow$ D – CCl$_3$ | –80 |
| H + Cl $\rightarrow$ HCl | –103 |
| CCl$_4$ + D – H $\rightarrow$ D – CCl$_3$ + HCl | $\Delta H = -11$ kcal/mole |

These reactions are more unbalanced than Example 1. However, carbon tetrachloride is cheaper than carbon tetrafluoride and the byproduct of HCl is easier to handle than HF.

EXAMPLE 3

Alternating Exposure to CH$_4$ and CBr$_4$

In this example, diamond is exposed to methane and carbon tetrabromide alternatively. Both reactions are exothermic and each exposure results in at least one monolayer of diamond. The reactions are exothermic because the H—Br bond is stronger than the H—C or the Br—C bonds.

| A. Exposure to CH$_4$: | |
|---|---|
| CH$_4 \rightarrow$ CH$_3$ + H | +104 kcal/mole |
| D – Br $\rightarrow$ D + Br | +62 |
| D + CH$_3 \rightarrow$ D – CH$_3$ | –80 |
| H + Br $\rightarrow$ HBr | –87 |
| CH$_4$ + D – Br $\rightarrow$ D – CH$_3$ + HBr | $\Delta H = -1.0$ kcal/mole |
| B. Exposure to CBr$_4$: | |
| CBr$_4 \rightarrow$ CBr$_3$ + Br | +68 kcal/mole |
| D – H $\rightarrow$ D + H | +91 |
| D + CBr$_3 \rightarrow$ D – CBr$_3$ | –80 |
| H + Br $\rightarrow$ HBr | –87 |
| CBr$_4$ + D – H $\rightarrow$ D – CBr$_3$ + HBr | $\Delta H = -8.0$ kcal/mole |

These reactions are also more unbalanced than Example 1. The byproduct HBr is not attractive so these reactions would only be used if other reactions did not work.

EXAMPLE 4

Alternating Exposure to CH$_4$ and CI$_4$

In this example, diamond is exposed to methane and carbon tetraiodide alternatively. One reaction is exothermic and one reaction is slightly endothermic. Each exposure results in at least one monolayer of diamond.

| A. Exposure to CH$_4$: | |
|---|---|
| CH$_4 \rightarrow$ CH$_3$ + H | +104 kcal/mole |
| D – I $\rightarrow$ D + I | +49.5 |
| D + CH$_3 \rightarrow$ D – CH$_3$ | –80 |
| H + I $\rightarrow$ HI | –71 |
| CH$_4$ + D – I $\rightarrow$ D – CH$_3$ + HI | $\Delta H = +2.5$ kcal/mole |
| B. Exposure to CI$_4$: | |
| CI$_4 \rightarrow$ CI$_3$ + I | +52 kcal/mole |
| D – H $\rightarrow$ D + H | +91 |
| D + CI$_3 \rightarrow$ D – CI$_3$ | –80 |
| H + I $\rightarrow$ HI | –71 |
| CI$_4$ + D – H $\rightarrow$ D – CI$_3$ + HI | $\Delta H = -8.0$ kcal/mole |

Reaction A is exothermic and would not go to completion. The byproduct HI is not attractive so reactions would only be used if other reactions did not work.

EXAMPLE 5

Alternating Exposure to CH$_4$ and CH$_3$OH

In this example, diamond is exposed by turns to methane and then methanol over and over again. These reactions always run downhill with respect to energy because the H—OH bond is stronger than both the Diamond-H and the Diamond-OH bond.

| A. Exposure to H$_2$: | |
|---|---|
| H$_2 \rightarrow$ H + H | +104 kcal/mole |
| D – OH $\rightarrow$ D + OH | +90.5 |
| D + H $\rightarrow$ D – H | –91 |
| H + OH $\rightarrow$ HOH | –119 |
| H$_2$ + D – OH $\rightarrow$ D – H + HOH | $\Delta H = -15.5$ kcal/mole |

-continued

B. Exposure to CH3OH:

| | |
|---|---|
| $CH_3OH \rightarrow CH_3 + OH$ | +91.5 kcal/mole |
| $D - H \rightarrow D + H$ | +91 |
| $D + CH_3 \rightarrow D - CH_3$ | −80 |
| $H + OH \rightarrow HOH$ | −119 |
| $CH_3OH + D - H \rightarrow D - CH_3 + HOH$ | $\Delta H = -16.5$ kcal/mole |

There is also a very attractive pair of reactions because both are exothermic and the byproduct is water.

EXAMPLE 7

Alternating Exposure to $H_2$ and $CF_4$

In this example, diamond is exposed in turn to hydrogen and then carbon tetrafluoride over and over again. Diamond growth only occurs during the $CF_4$ exposure. These reactions always run downhill with respect to energy because the H—F bond is stronger than both the Diamond-H bond and the Diamond-F bond.

A. Exposure to $H_2$:

| | |
|---|---|
| $H_2 \rightarrow H + H$ | +104 kcal/mole |
| $D - F \rightarrow D + F$ | +103 |
| $D + H \rightarrow D - H$ | −91 |
| $H + F \rightarrow HF$ | −135 |
| $H_2 + D - F \rightarrow D - H + HF$ | $\Delta H = -19$ kcal/mole |

B. $CH_4 \rightarrow CF_3 + F$ +116 kcal/mole

| | |
|---|---|
| $D - H \rightarrow D + H$ | +91 |
| $D + CF_3 \rightarrow D - CF_3$ | −80 |
| $H + F \rightarrow HF$ | −135 |
| $CF_1 + D - H \rightarrow D - CF_3 + HF$ | $\Delta H = -8$ kcal/mole |

EXAMPLE 8

Alternating Exposure to $H_2$ and $CCL_4$

In this example, diamond is exposed in turn to hydrogen and then carbon tetrachloride over and over again. Diamond growth only occurs during the $CCL_4$ exposure. These reactions always run downhill with respect to energy because the H—CL bond is stronger than both the Diamond-H bond and the Diamond-CL bond.

A. Exposure to $H_2$:

| | |
|---|---|
| $H_2 \rightarrow H + H$ | +104 kcal/mole |
| $D - CL \rightarrow D + CL$ | +78.5 |
| $D + H \rightarrow D - H$ | −91 |
| $H + CL \rightarrow HCL$ | −103 |
| $H_2 + D - CL \rightarrow D - H + HCL$ | $\Delta H = -11.5$ kcal/mole |

B. Exposure to $CCL_4$:

| | |
|---|---|
| $CCL_4 \rightarrow CCL_3 + CL$ | +81 kcal/mole |
| $D - H \rightarrow D + H$ | +91 |
| $D + CCL_3 \rightarrow D - CCL_3$ | −80 |
| $H + CL \rightarrow HCL$ | −103 |
| $CCL_4 + D - H \rightarrow D - CCL_3 + HCL$ | $\Delta H = -11$ kcal/mole |

The byproduct of this reaction is HCl.

EXAMPLE 9

Alternating Exposure to $H_2$ and $CBr_4$

In this example, diamond is exposed in turn to hydrogen and then carbon tetrabromide over and over again. Diamond growth only occurs during the $CBr_4$ exposure. These reactions run downhill with respect to energy because the H—Br bond is stronger than both the Diamond-H and the Diamond-Br bond.

A. Exposure to $H_2$:

| | |
|---|---|
| $H_2 \rightarrow H + H$ | +104 kcal/mole |
| $D - Br \rightarrow D + Br$ | +78.5 |
| $D + H \rightarrow D H$ | −91 |
| $H + Br \rightarrow HBr$ | −103 |
| $H_2 + D - Br \rightarrow D - H + HBr$ | $\Delta H = -11.5$ kcal/mole |

B. Exposure to $CBr_4$:

| | |
|---|---|
| $CBr_4 \rightarrow CBr_3 + Br$ | +81 kcal/mole |
| $D - H \rightarrow D + H$ | +91 |
| $D + CBr_3 \rightarrow D - CBr_3$ | −80 |
| $H + Br \rightarrow HBr$ | −103 |
| $CBr_4 + D - H \rightarrow D - CBr_3 + HBr$ | $\Delta H = -11$ kcal/mole |

This pair of reactions is well balanced with each having an exothermic enthalpy of about −11 kcal/mole.

EXAMPLE 10

Alternating Exposure to $H_2$ and $CI_4$

In this example, diamond is exposed in turn to hydrogen and then carbon tetraiodide over and over again. Diamond growth only occurs during the $CI_4$ exposure. These reactions always run downhill with respect to energy because the H—I bond is stronger than both the Diamond-H and the Diamond-I bond.

A. Exposure to $H_2$:

| | |
|---|---|
| $H_2 \rightarrow H + H$ | +104 kcal/mole |
| $DI \rightarrow D + I$ | +49.5 |
| $D + H \rightarrow D - H$ | −91 |
| $H + I \rightarrow HI$ | −71 |
| $H_2 + D - I \rightarrow D - H + HI$ | $\Delta H = -8.5$ kcal/mole |

B. Exposure to $CI_4$:

| | |
|---|---|
| $CI_4 \rightarrow CI_3 + I$ | +52 kcal/mole |
| $D - H \rightarrow D + H$ | +91 |
| $D + CI_3 \rightarrow D - CI_3$ | −80 |
| $II + I \rightarrow HI$ | −71 |
| $CI_4 + D - H \rightarrow D - CI_3 + HI$ | $\Delta H = -8$ kcal/mole |

This pair of reactions is well balanced. The iodine could be recaptured by decomposing the HI at the end of the reactor.

EXAMPLE 11

Alternating Exposure to $F_2$ and $CH_4$

In this example, diamond is exposed in turn to methane and then fluorine over and over again. These reactions always run downhill with respect to energy because the H—F bond is stronger than both the Diamond-C and the Diamond-F bond.

A. Exposure to $CH_4$:

| | |
|---|---|
| $CH_4 \rightarrow CH_3 + H$ | +104 kcal/mole |
| $D - F \rightarrow D + F$ | +103 |
| $D + CH_3 \rightarrow D - CH_3$ | −80 |
| $H + F \rightarrow HF$ | −135 |
| $CH_4 + D - F \rightarrow D - CH_3 + HF$ | $\Delta H = -8$ kcal/mole |

B. Exposure to $F_2$:

| | |
|---|---|
| $F_2 \rightarrow F + F$ | +37 kcal/mole |

| | |
|---|---|
| $D - H \rightarrow D + H$ | $+91$ |
| $D + F \rightarrow D - F$ | $-103$ |
| $H + F \rightarrow HF$ | $-135$ |
| $F_2 + D - H \rightarrow D - F + HF$ | $\Delta H = -110$ kcal/mole |

The latter reaction is strongly exothermic. However, $F_2$ is difficult to handle.

EXAMPLE 12

Alternating Exposure to $Cl_2$ and $CH_4$

In this example, diamond is exposed in turn to methane and then chlorine over and over again. These reactions always run downhill with respect to energy because the H—Cl bond is stronger than both the Diamond-C and the Diamond-CL bond.

A. Exposure to $CH_4$:

| | |
|---|---|
| $CH_4 \rightarrow CH_3 + H$ | $+104$ kcal/mole |
| $D - CL \rightarrow D + CL$ | $+78.5$ |
| $D + CH_3 \rightarrow D\ CH_3$ | $-80$ |
| $H + CL \rightarrow HCL$ | $103$ |
| $CH_4 + D - CL \rightarrow D - CH_3 + HCL$ | $\Delta H = -0.5$ kcal/mole |

B. Exposure to $CL_2$:

| | |
|---|---|
| $CL_2 \rightarrow CL + CL$ | $+58$ kcal/mole |
| $D - H \rightarrow D + H$ | $+91$ |
| $D + CL \rightarrow D - CL$ | $-78.5$ |
| $H + CL \rightarrow HCL$ | $-103$ |
| $CL_2 + D - H \rightarrow D - CL + HCL$ | $\Delta H = -32.5$ kcal/mole |

The latter reaction is strongly exothermic. However, the first reaction is almost in balance and may deter from the overall process.

EXAMPLE 13

Alternating Exposure to $I_2$ and $CH_4$

In this example, diamond is exposed in turn to methane and then iodine over and over again.

A. Exposure to $CH_4$:

| | |
|---|---|
| $CH_4 \rightarrow CH_3 + H$ | $+104$ kcal/mole |
| $D - I \rightarrow D + I$ | $+49.5$ |
| $D + CH_3 \rightarrow D - CH_3$ | $-80$ |
| $H + I \rightarrow HI$ | $-71$ |
| $CH_4 + D - I \rightarrow D - CH_3 + HI$ | $\Delta H = -2.5$ kcal/mole |

B. Exposure to $I_2$:

| | |
|---|---|
| $I_2 \rightarrow I + I$ | $+37$ kcal/mole |
| $D - H \rightarrow D + H$ | $+91$ |
| $D + I \rightarrow D - I$ | $-49.5$ |
| $H + I \rightarrow HI$ | $-71$ |
| $I_2 + D - H \rightarrow D - I + HI$ | $\Delta H = +6.5$ kcal/mole |

Unlike other halogen-methane pairs, this pair of reactions is unfavorable because the latter is exothermic and the former is only slightly exothermic.

EXAMPLE 14

Alternating Exposure to $Br_2$ and $CH_4$

In this example, diamond is exposed by turns to methane and then bromine over and over again. These reactions always run downhill with respect to energy because the H—Br bond is stronger than both the Diamond-C and the Diamond-Br bond.

A. Exposure to $CH_4$:

| | |
|---|---|
| $CH_4 \rightarrow CH_3 + H$ | $+104$ kcal/mole |
| $D - Br \rightarrow D + Br$ | $+63$ |
| $D + CH_3 \rightarrow D - CH_3$ | $-80$ |
| $H + Br \rightarrow HBr$ | $-88$ |
| $CH_4 + D - Br \rightarrow D - CH_3 + HBr$ | $\Delta H = 0$ kcal/mole |

B. Exposure to $Br_2$:

| | |
|---|---|
| $Br_2 \rightarrow Br + Br$ | $+46$ kcal/mole |
| $D - H \rightarrow D + H$ | $+91$ |
| $D + Br \rightarrow D - Br$ | $-63$ |
| $H + Br \rightarrow HBr$ | $-87$ |
| $Br_2 + D - H \rightarrow D - Br + HBr$ | $\Delta H = -13$ kcal/mole |

This pair of reactions is unbalanced with reaction A showing a zero enthalpy change. Because of this and an undesirable byproduct, this reaction pair is not as favorable as other pairs.

In all cases, $CH_4$ and $CH_3OH$ can be replaced by other alkanes and alcohols. Similarly, the halocarbons can be replaced by analogous substitutes. Furthermore, many other hydrocarbons, halocarbons, and other compounds in pairs of reactions will cause a C—H bond to be severed and replaced by a C—X bond (where X=F, Cl, I, Br, OH, O, N, etc.) or a C—X bond to be severed and replaced by a C—H bond with an H—X bond forming in both cases. The reaction pair is driven by the fact that the H—X bond is stronger than either the C—H bond or the C—X bond. Also, while the invention is illustrated for a pair of reactive gases, it will be appreciated that three or more gases could be used in accordance with the precepts of the present invention.

The reactions can be carried out at atmospheric, sub-atmospheric, or super-atmospheric pressures. Also, means to excite the gases to overcome activation energy barriers can be added, such as, for example, RF, microwaves, thermal heating, light, laser radiation, plasma discharges, and the like.

The reactants also can be diluted with carrier gases, such as, for example, the noble gases, nitrogen, and hydrogen. Also, if gas-gas reactions have a detrimental effect on the diamond growth, a carrier gas can be used to sweep out the reaction vessel between each exposure to alternate reaction gases to eliminate gas-gas reactions between the two reactant gases.

In other respects, the process is carried out in conventional CVD diamond deposition fashion as those skilled in the art will appreciate. In this application, all citations are expressly incorporated herein by reference.

We claim:

1. A method for growing diamond on a diamond substrate by chemical vapor deposition substantially free of atomic hydrogen which comprises:
   alternatingly contacting at elevated temperature said diamond substrate with a gas having the formula $C_nX_m$ and then with a gas having the formula $C_lZ_p$, wherein
   (a) X and Z each form single bonds with C;
   (b) X and Z are reactable to form ZX or a derivative thereof;
   (c) the Z—X bond is stronger than the C—X bond; and
   (d) the Z—X bond is stronger then the C—Z bond, wherein n, m, l, and p are integers wherein l can be zero.

2. The method of claim 1 wherein said elevated temperature ranges from between about 500° and 100° C.

3. The method of claim 1 wherein $C_nX_m$ and $C_lZ_p$ are selected from the group consisting of $CH_4$, $CF_4$; $CH_4$, $CCL_4$; $CH_4$, $CBr_4$; $CH_4$, $CI_4$; $CH_4$, $CH_3OH$; $H_2$, $CH_3OH$; $H_2$, $CF_4$; $H_2$, $CCl_4$; $H_2$, $CBr_4$; $H_2$, $CI_4$; $CH_4$, $F_2$; $Cl_2$, $CH_4$; $I_2$, $CH_4$; and $Br_2$, $CH_4$.

4. The method of claim 1 wherein a carrier gas is used with said gases.

5. The method of claim 1 wherein l is zero and $Z_p$ is $H_2$.

* * * * *